United States Patent
Colgan et al.

(10) Patent No.: US 9,568,960 B2
(45) Date of Patent: Feb. 14, 2017

(54) SUPERCOMPUTER USING WAFER SCALE INTEGRATION

(71) Applicant: INTERNATIONAL BUSINESS MACHINES CORPORATION, Armonk, NY (US)

(72) Inventors: Evan G. Colgan, Yorktown Heights, NY (US); Monty M. Denneau, Yorktown Heights, NY (US); John Knickerbocker, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 51 days.

(21) Appl. No.: 14/627,657

(22) Filed: Feb. 20, 2015

(65) Prior Publication Data

US 2016/0246337 A1    Aug. 25, 2016

(51) Int. Cl.
*H01L 23/473* (2006.01)
*G06F 1/18* (2006.01)
(Continued)

(52) U.S. Cl.
CPC ............... *G06F 1/185* (2013.01); *G06F 1/20* (2013.01); *H01L 23/367* (2013.01);
(Continued)

(58) Field of Classification Search
CPC ...... G06F 1/185; G06F 1/20; H01L 23/49816; H01L 23/367; H01L 23/473; H01L 23/49838

See application file for complete search history.

(56) References Cited

U.S. PATENT DOCUMENTS

| 4,703,436 A | 10/1987 | Varshney |
| 5,050,039 A | 9/1991 | Edfors |

(Continued)

OTHER PUBLICATIONS

M. B. Ketchen et al., "A Josephson technology system level experiment," IEEE Electron Device Letters, vol. 2, No. 10, 1981, pp. 262-265.

(Continued)

*Primary Examiner* — Kyoung Lee
(74) *Attorney, Agent, or Firm* — F. Chau & Associates, LLC (57) ABSTRACT

A semiconductor structure includes a substrate with cooling layers, cooling channels, coolant inlets and outlets in fluid communication with the cooling channels, and a device layer on the cooling layers with one or more connection points and a device layer area. The device layer thermal coefficient of expansion is substantially equal to that of the cooling layers. A plurality of laminate substrates are disposed on, and electrically attached to, the device layer. The laminate substrate thermal coefficient of expansion differs from that of the device layer, each laminate substrate is smaller than the device layer portion to which it is attached, and each laminate substrate includes gaps between sides of adjacent laminate substrates. The laminate substrates are not electrically or mechanically connected to each other across the gaps therebetween and the laminate substrates are small enough to prevent warping of the device, interconnection and cooling layers due to thermal expansion.

16 Claims, 9 Drawing Sheets

Section B-B (51) Int. Cl.
    *G06F 1/20*         (2006.01)
    *H01L 23/367*     (2006.01)
    *H01L 23/498*     (2006.01)

(52) U.S. Cl.
    CPC ...... *H01L 23/473* (2013.01); *H01L 23/49816* (2013.01); *H01L 23/49838* (2013.01)

(56) References Cited

U.S. PATENT DOCUMENTS

| | | |
|---|---|---|
| 5,126,828 A | 6/1992 | Hatta et al. |
| 5,349,219 A * | 9/1994 | Murao ................ H01L 27/0207 257/208 |
| 5,510,655 A | 4/1996 | Tanielian |
| 5,696,404 A | 12/1997 | Murari et al. |
| 6,448,575 B1 | 9/2002 | Slocum et al. |
| 7,411,472 B1 | 8/2008 | West et al. |
| 7,884,007 B2 | 2/2011 | Chia et al. |

OTHER PUBLICATIONS

M. Yasunaga et al., "Design, fabrication and evaluation of a 5-inch wafer scale neural network LSI composed on 576 digital neurons," International Joint Conference on Neural Networks, IJCNN, 1990, pp. 527-535.

P. Ivey, "The ELSA wafer scale integration project." IEEE Transactions on Components, Hybrids, and Manufacturing Technology, vol. 16, No. 7, 1993, pp. 626-636.

* cited by examiner

FIG. 3
Detail "B"

FIG. 4
Section B-B

SUPERCOMPUTER USING WAFER SCALE INTEGRATION

BACKGROUND

Technical Field

Embodiments of the present disclosure are directed to massively parallel supercomputers made from multi-core processor chips.

Discussion of the Related Art

Contemporary supercomputers typically use thousands of processors that are either distributed across a network or are placed in close proximity to each other as in a centralized computer cluster. More recently, supercomputers have started using multi-core processors, with the idea of developing a supercomputer on a chip. The bisectional bandwidth between separate processor chips in a supercomputer is typically limited by the speed and number of electrical links which can be provided between the processors. The available bandwidth between processors on the same chip is significantly higher than what can typically be provided between processors on different chips. The size of individual chips is limited by lithographic field size, yield, and chip packaging technology, and the number of electrical connections between chips is also limited by chip packaging technology. Electrical interconnects within a chip are cheaper and use less power than electrical interconnects between chips on the same substrate, which are cheaper and use less power than electrical interconnects between substrates, etc. A number of useful computational tasks can be limited by the available bisectional bandwidth, such as sparse matrix multiplication used in natural language processing, or large fast Fourier transforms (FFTs).

SUMMARY

According to an embodiment of the disclosure, there is provided a semiconductor structure that includes a substrate that includes one or more cooling layers, one or more cooling channels, one or more coolant inlets and outlets in fluid communication with the cooling channels, a device layer disposed on the cooling layers that has one or more connection points and a device layer area, wherein a device layer thermal coefficient of expansion is substantially equal to that of the one or more cooling layers, a plurality of laminate substrates arranged in an array that are disposed on, and electrically attached to, the device layer, wherein a laminate substrate thermal coefficient of expansion differs from that of the device layer, and each laminate substrate is smaller in area than an area of the device layer portion to which it is attached, and each laminate substrate includes sides with gaps between sides of adjacent laminate substrates, wherein the laminate substrates are not electrically or mechanically connected to each other across the gaps between laminate substrates and the laminate substrates are small enough to substantially prevent warping and unacceptable stress of the device layer, interconnection and cooling layers due to thermal expansion.

According to a further embodiment of the disclosure, the laminate substrates comprise one or more of a PC board, a ceramic or glass substrate, and a built-up organic substrate and the device layer is rigidly attached to the cooling layers by a material with a high thermal conductivity.

According to a further embodiment of the disclosure, the device layer comprises one or more semiconductor wafers.

According to a further embodiment of the disclosure, the substrate comprise one or more of glass and a semiconductor material.

According to a further embodiment of the disclosure, the connection points comprise C4 micro solder balls disposed between the device layer and the laminate substrates.

According to a further embodiment of the disclosure, the semiconductor structure includes a plurality of semiconductor structures, a wafer gap between each semiconductor structure, and one or more electrical connections between laminate substrates on different semiconductor structures across the wafer gaps, where one or more of the coolant inlets and outlets of each semiconductor structure are connected to form a common cooling system.

According to another embodiment of the disclosure, there is provided a data processing structure that includes a semiconductor processor wafer containing two or more chips interconnected by on chip wiring levels rigidly attached on a non-device side of the semiconductor processor wafer to a liquid cooled substrate with a thermal coefficient of expansion substantially similar to that of the semiconductor processor wafer, wherein substrates of each chip are attached to individual chips on a device side of each wafer.

According to a further embodiment of the disclosure, the chip substrates are smaller in area than the chips on the wafer.

According to a further embodiment of the disclosure, the data processing structure includes one or more cards attached to each chip substrate, wherein a major surface of each card is perpendicular to a surface of the semiconductor processor wafer.

According to a further embodiment of the disclosure, the data processing structure includes one or more additional wafers stacked between the semiconductor processor wafer and the chip substrates that are electrically interconnected with the semiconductor processor wafer and the chip substrates.

According to another embodiment of the disclosure, there is provided a super computer structure that includes two or more semiconductor processor wafers, each containing two or more chips interconnected by on chip wiring levels rigidly attached on a non-device side of the semiconductor processor wafer to one or more silicon microchannel wafers which are attached to a common set of manifold layers to provide liquid cooling, and interconnect substrates configured to provide signaling between adjacent semiconductor processor wafers, where the manifold layers have a thermal coefficient of expansion substantially similar to that of the silicon microchannel wafers, and chip substrates are attached to each chip on a device side of the semiconductor processor wafer.

According to a further embodiment of the disclosure, the manifold layers comprise one or more of integrated glass or silicon layers, and one or more stacked silicon layers.

According to a further embodiment of the disclosure, the semiconductor processor wafers include multiple stacked wafers that are integrated by vertical interconnections.

According to a further embodiment of the disclosure, the semiconductor processor wafers include one or more of a memory wafer, a processor wafers, and a field programmable gate array (FPGA).

According to a further embodiment of the disclosure, each chip substrate includes one of an organic material, a ceramic material, or a silicon material, and each chip substrate is configured to provide the semiconductor processor wafer with power, voltage regulation, and signal communication.

According to a further embodiment of the disclosure, signaling between adjacent semiconductor processor wafers uses one or more electrical signals and optical signals.

DETAILED DESCRIPTION

Exemplary embodiments of the disclosure as described herein generally include supercomputers fabricated using wafer-scale integration, and methods for fabricating the same. Accordingly, while embodiments of the disclosure are susceptible to various modifications and alternative forms, specific embodiments thereof are shown by way of example in the drawings and will herein be described in detail. It should be understood, however, that there is no intent to limit embodiments of the disclosure to the particular exemplary embodiments disclosed, but on the contrary, embodiments of the disclosure cover all modifications, equivalents, and alternatives falling within the spirit and scope of the disclosure.

Exemplary embodiments of the present disclosure include a wafer whose surface is fully populated with chips composed of many small processors that are electrically interconnected using the upper levels of chip wiring, a connection scheme known as wafer scale integration. Chip to chip interconnects are typically limited to hundreds or thousands of signal channels. The bisection of the wafer may contain millions of wires, each of which can run at multiples of 1 gbit/sec or with fat wires at higher rates. For example, just on the top 6 layers of a 300 mm wafer there may be about a million connections crossing the wafer center line using IBM's Cu-32 custom logic silicon-on-insulator (SOI) chipmaking technology.

The use of many small cores on a single wafer with a significant degree of redundancy, especially in the network between cores, allows for the use of functioning cores without the loss of an entire wafer when not all cores are fully functional. In addition, depending on the application, one or more of a processor, memory, network, field programmable gate array (FPGA), optics, power inductor, voltage regulator, integrated capacitance layer, or alternate technology wafer may be heterogeneously integrated by means of wafer level stacking that uses vertical interconnection between layers, thru-silicon vias (TSV) and silicon-on-insulator (SOI) and/or bulk wafer technology to create wafer stacks.

To mechanically support and stiffen the processor wafer, it may be attached by solder, a thermal interface material (TIM), polymer adhesive, or other means to a wafer scale microchannel cooler fabricated from silicon and/or a material such as glass which has a thermal coefficient of expansion (TCE) equivalent to that of silicon. The cooler may contain multiple manifold layers that are joined into one integrated manifold with liquid cooling channels for delivering cooling fluid to microchannel cooling channels, and an exit.

To provide power and signals to the processor wafer, an array of mechanically decoupled laminates or ceramic substrates may be attached. The laminate may be joined to the processor wafer using indium or alternate low temperature or intermediate temperature solder materials, such either eutectic PbSn or Pb free solders, that also enable low stress solder C4s to allow increased laminate or substrate size and support power delivery and communication requirements. Solder ball attach, land grid array (LGA) or sockets are used to connect a flex, or a printed circuit card to the substrate to provide signals and power, and to maintain mechanical decoupling. Optical links may also be used for high speed data communication links to and from the laminates or substrates attached to the wafer or wafer stack.

The laminates may contain power conversion components or capacitors. Additional flex circuits, LGAs, optical links or socket interconnections may be disposed off the wafer substrate to provide additional component area and/or input/output (I/O). All flex circuits connect to common board(s) for power and signal I/O.

Embodiments of the disclosure may include a test methodology to identify good circuits in each wafer and/or wafer stack, and to drive self repair or isolation for functionality during start up and application use.

Embodiments of the disclosure may also include low power circuits for data communication between functioning processor cores, memory and cores, and other functional elements of the integrated wafer level subsystem and other integrated systems.

Other embodiments of the disclosure may enhance thermal cooling for stacked wafer components with use of through-silicon-vias (TSV), thermal design optimization and self power regulation.

Figure 1:
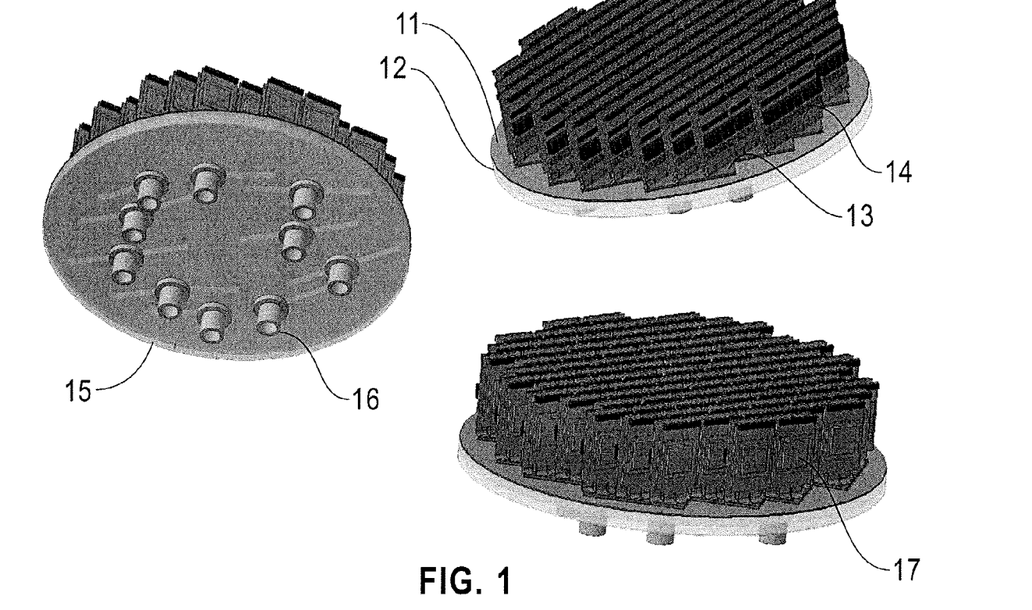
FIG. 1 illustrates an overall structure of an embodiment of the disclosure.
Figure 2:
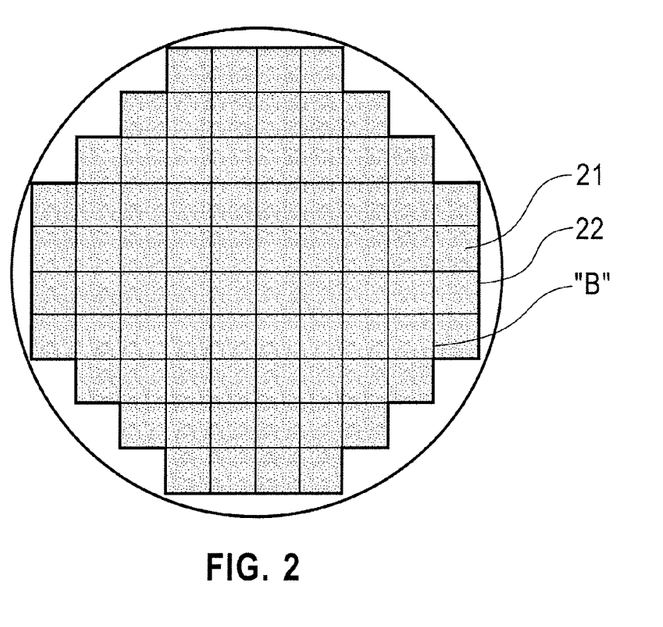
FIG. 2 is a schematic view of a full wafer according to an embodiment of the disclosure.
Figure 3:
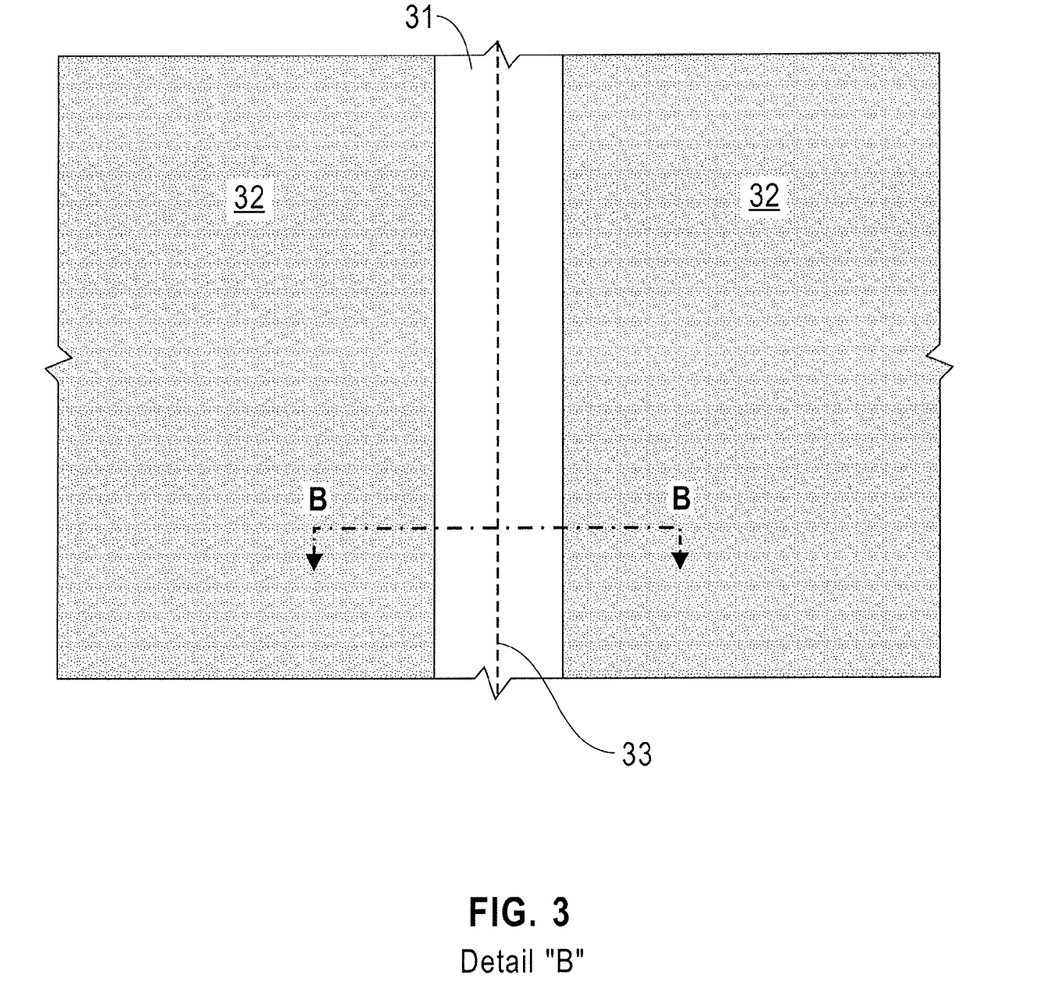
FIG. 3 is a detailed top down view of a connection zone between active chip areas according to an embodiment of the disclosure.
Figure 4:
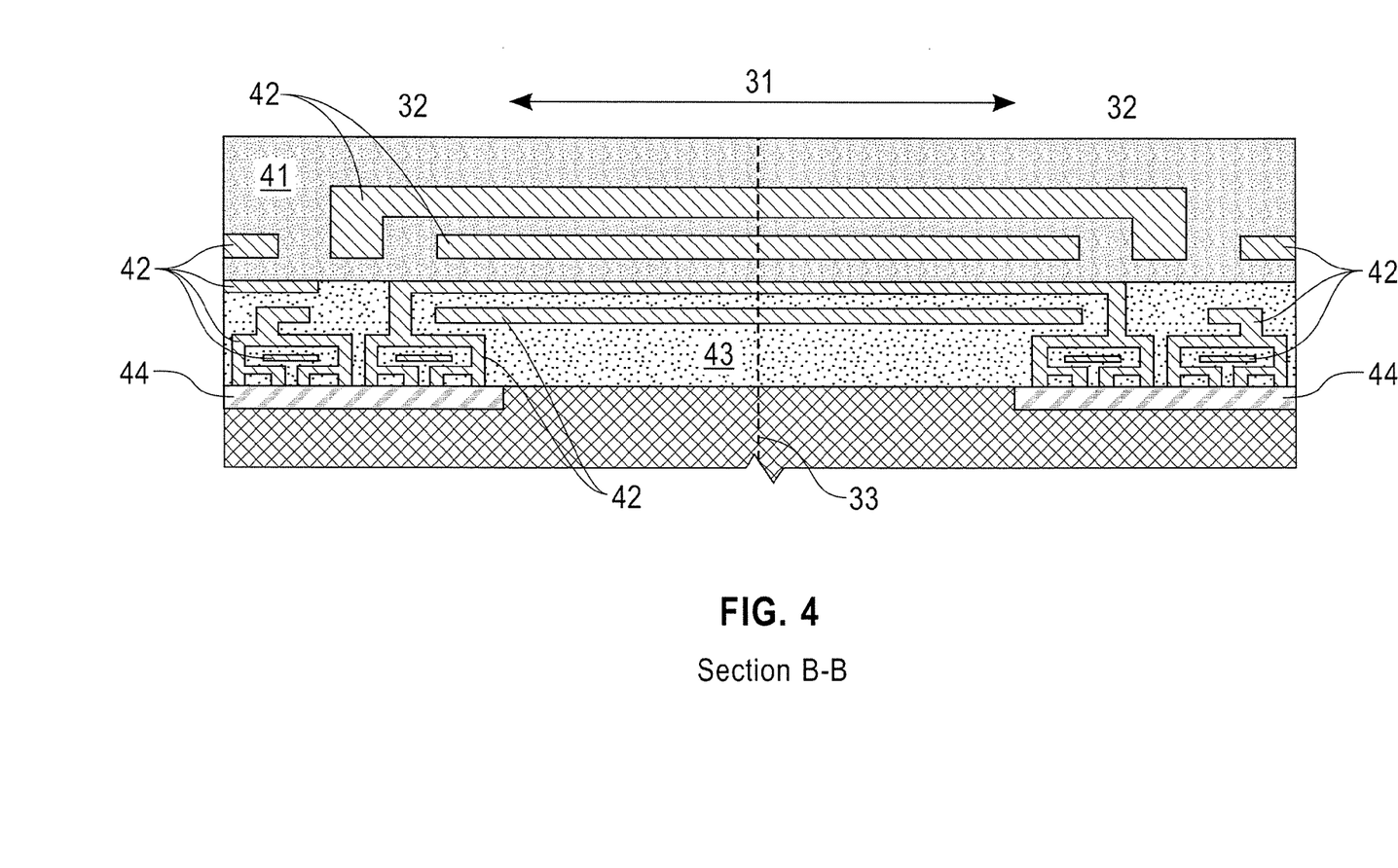
FIG. 4 is a schematic cross sectional view that illustrates wiring between active chip areas in a connection zone according to an embodiment of the disclosure.
Figure 5A:
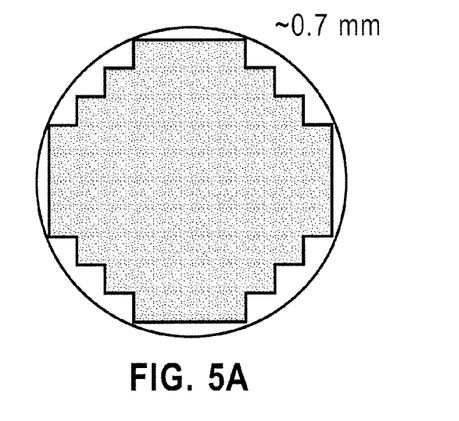
FIGS. 5A-F are schematic drawings of the layers which compose a wafer microchannel cooler and manifold according to an embodiment of the disclosure.
Figure 5B:
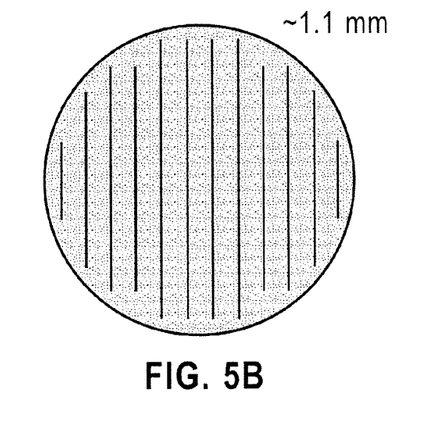
Figure 5C:
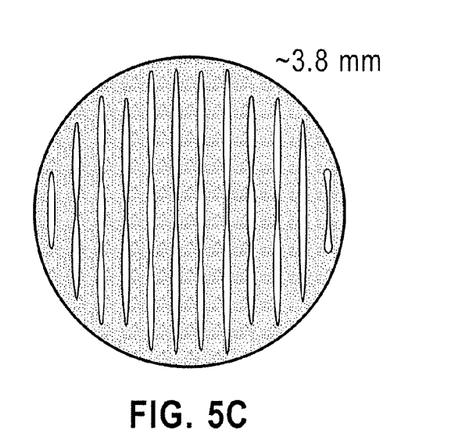
Figure 5D:
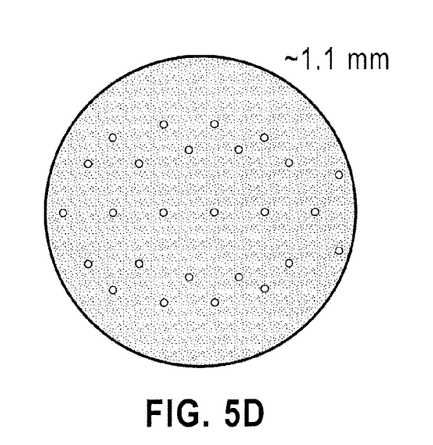
Figure 5E:
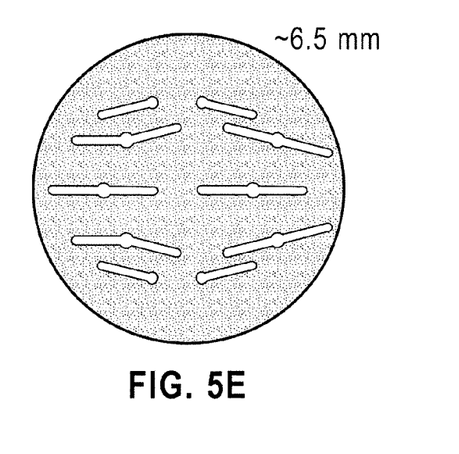
Figure 5F:
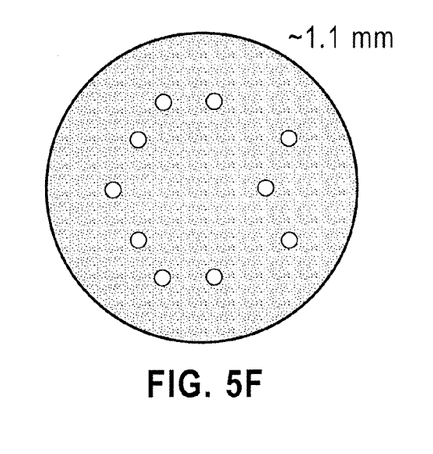
Figure 6:
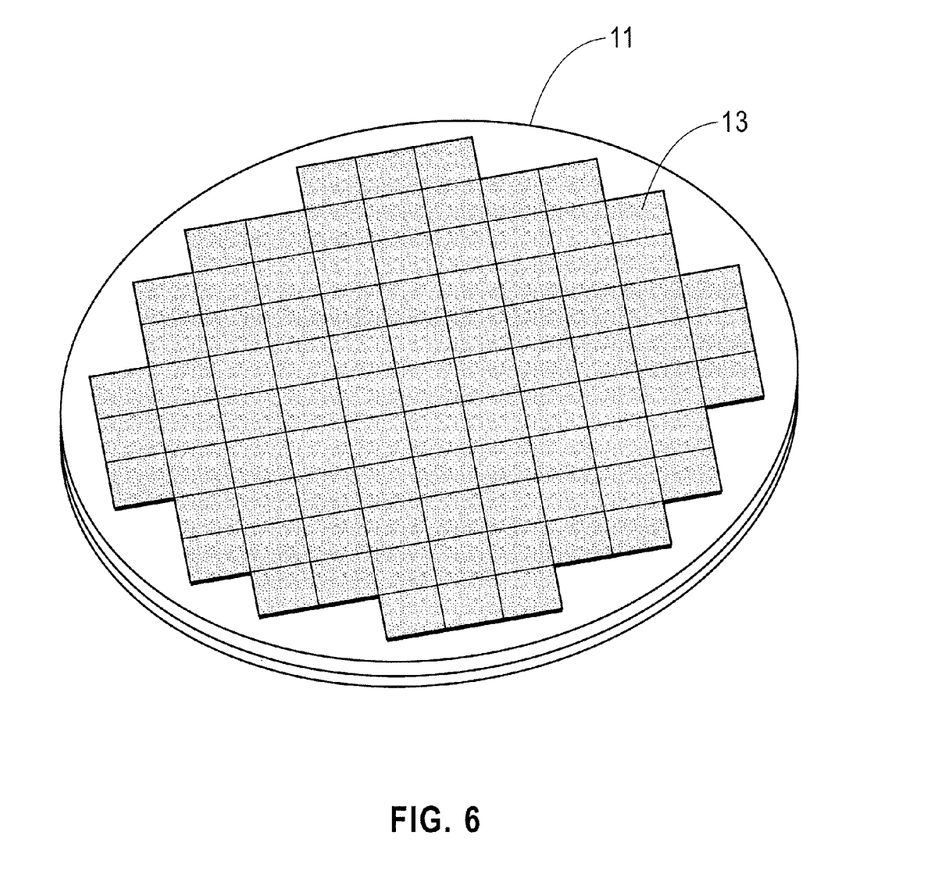
FIG. 6 is a schematic illustration of the chip substrates attached to an active device wafer previously bonded to a microchannel cooler and manifold according to an embodiment of the disclosure.
Figure 7:
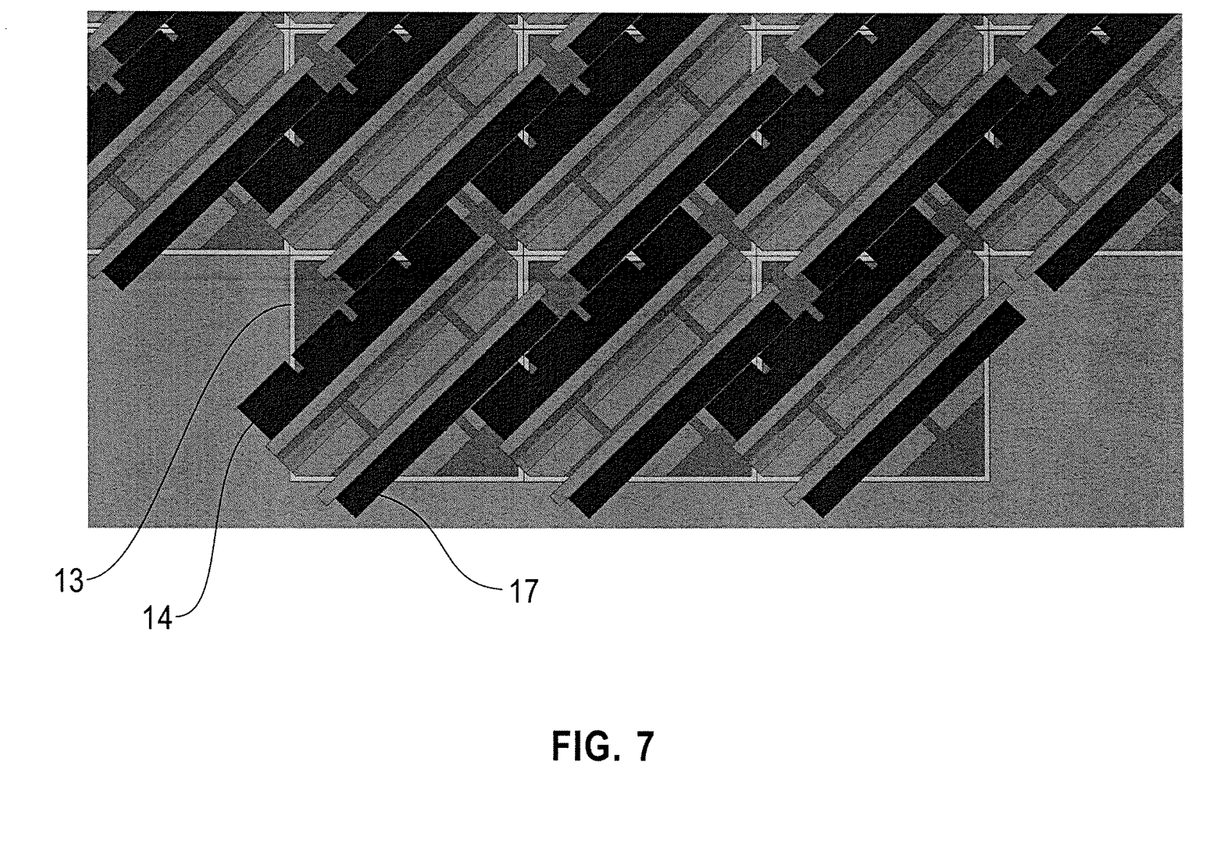
FIG. 7 is a detailed top down schematic view that illustrates individual chip substrates and that the chip substrates are smaller than the chip pitch.
Figure 8:
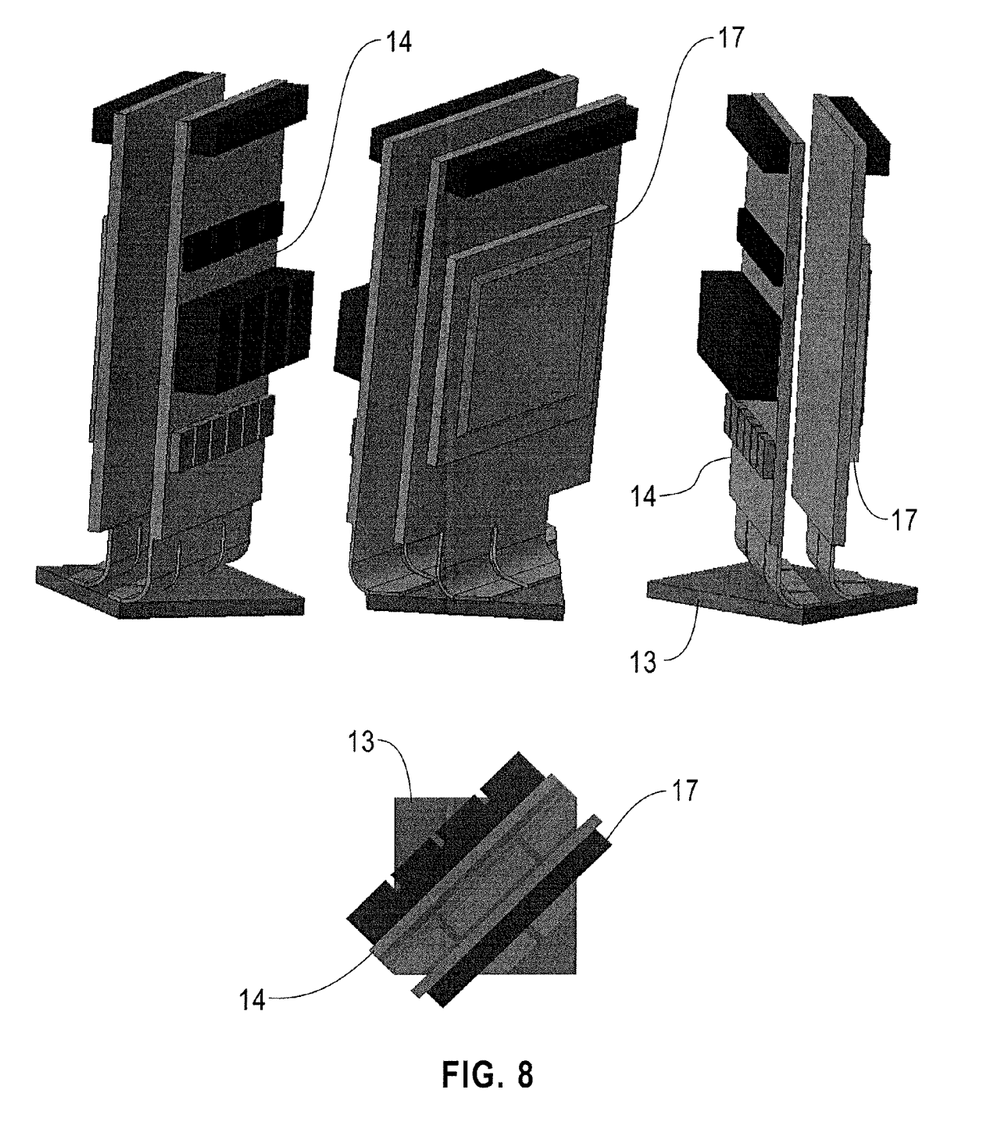
FIG. 8 is a perspective view of a vertical power card and a vertical I/O card attached to a single die substrate according to an embodiment of the disclosure.

An overview of a data processing structure according to an embodiment of the disclosure is shown in FIG. 1, and FIGS. 2-8 illustrate subsections that will be described in further detail below. Components shown in FIG. 1 include a product wafer 11 on a microchannel cooler wafer 12, vertical power cards 14 and vertical I/O cards 17 mounted on a die substrate 13 on the product wafer 11, glass manifold layers 15 under the microchannel wafer 12, and inlet/outlet fittings 16 protruding downward from the glass manifold layers 15. FIGS. 2-4 show a product wafer containing multiple chips, FIG. 5 shows the microchannel cooler wafer 12 and the glass manifold layers 15, FIGS. 6-8 show multiple individual die substrates 13, and the vertical power and vertical I/O cards 14 and 17.

Figure 10:
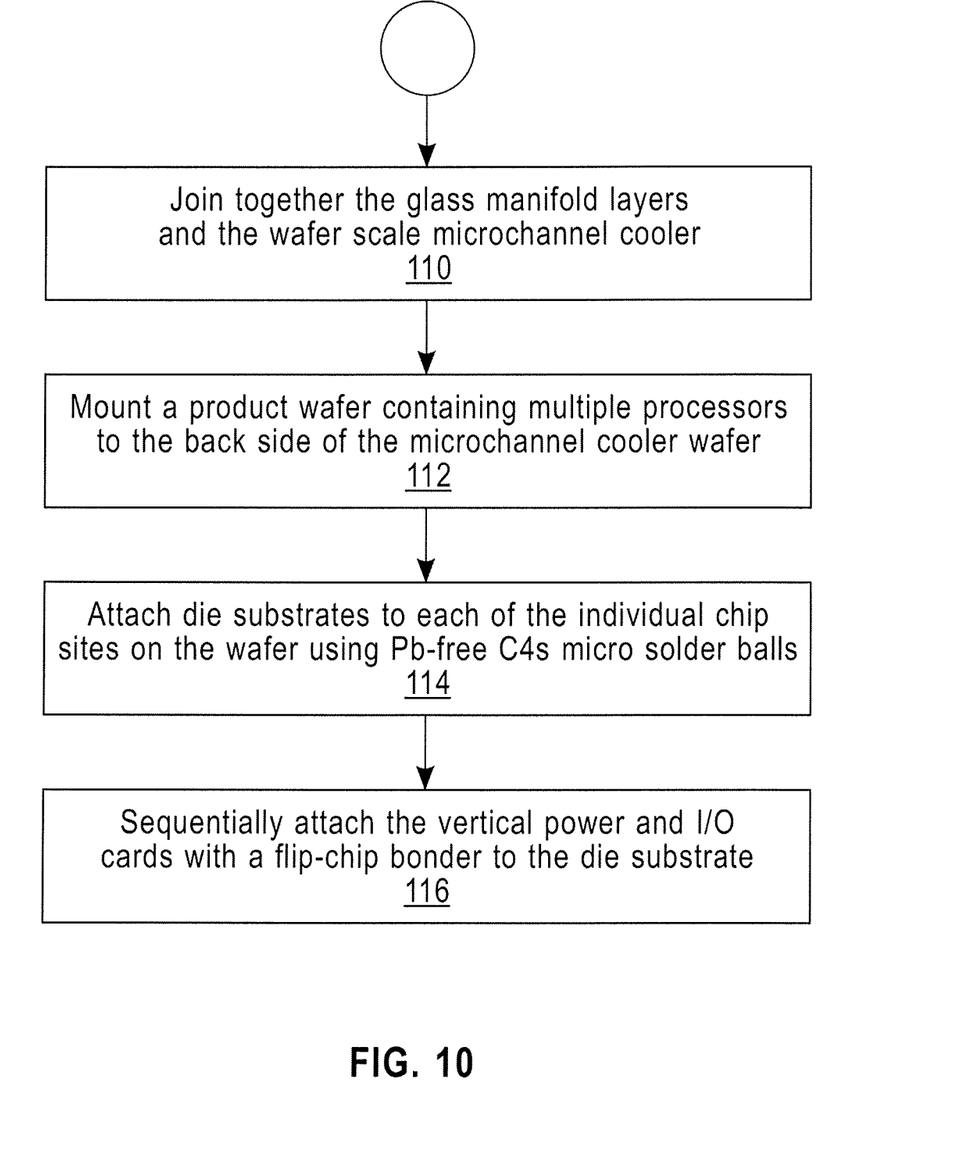
FIG. 10 is a flow chart of an exemplary, non-limiting method of fabricating a data processing structure according to an embodiment of the disclosure.

A flow chart of an exemplary, non-limiting method of fabricating a data processing structure according to an embodiment of the disclosure is presented in FIG. 10. Referring now to the figure, the assembly begins at step 110 by joining together the glass manifold layers 15 and the wafer scale microchannel cooler 12. An exemplary, non-limiting material for joining the glass manifold layers and the wafer scale microchannel cooler may be a glass frit material such as Ferro 11-036. The glass may be a material such as Borofloat 33, which has a coefficient of thermal expansion (TCE) that is closely matched to that of silicon. The microchannel cooler is formed from a silicon wafer. Next, at step 112, a product wafer that contains multiple processors is mounted to the back side of the microchannel cooler wafer using a rigid highly thermally conductive means, such as a layer of a high lead solder. Exemplary, non-limiting high lead solders include Pb—Sn 97:3 or 95:5. Other solder compositions or similar materials maybe used. The materials used to form the cooling structure should have a CTE that matches the CTE of the wafer containing the multiple processors so that the wafers can be rigidly joined to increase the stiffness of the processor wafer and provide the highest possible cooling performance. The use of a rigid joining means such as solder allows for a lower thermal resistance joint then could be achieved with a typical thermal interface material (TIM), such as a grease, paste, or a wax containing thermally conductive particles. To enable assembly of die substrates and vertical cards to the wafer, the wafer should also be reinforced since silicon is a crystalline material that can easily be fractured, especially considering that the processor wafer may be 300 mm or more in diameter but is only about 0.8 mm thick. The rigid attachment of the cooling structure provides this reinforcement.

The assembly process continues at step 114 by using Pb-free C4s micro solder balls to attach die substrates to each of the individual chip sites on the wafer. Note that alternate solder materials maybe used for the C4s as long as the melting point is less than that of the solder used in step 112 above. The micro solder balls may have about a 150 to 200 micron pitch. The substrates may be formed from either a ceramic material or an organic build-up material, and the substrates are slightly smaller than the chip pitch on the wafer so that a clearance gap exists between the multiple substrates. Depending on the chip size, a ceramic material maybe used so the CTE may closely match that of silicon, which can help minimize the stress on the C4 micro solder balls and on chip wiring layers during thermal cycling. Next, at step 116, the vertical power and I/O cards are sequentially attached with a flip-chip bonder to the die substrates using eutectic Pb—Sn BGA (ball grid array) solder balls. The solder balls may have a pitch of about 0.5 to 1 mm. An alternate solder material may be used as long as the melting point is less than that of the solder used in step 114 above, or if the C4s have been underfilled than solder materials with an equal or higher melting point maybe used as long as the C4 joints are not damaged.

FIGS. 2-4 illustrate a product wafer that contains multiple processors. FIG. 2 shows a schematic view of an exemplary, non-limiting 300 mm diameter wafer that contains 89 chips sites 21, each about 24 mm on a side. The full wafer is packaged without dicing. The chips are composed of an active chip area, which contains active semiconductor devices such as processors, memory, and other logical elements, and a connection zone 22 around the perimeter, which contains no active devices. The chips may be identical, or may be a mixture of different chips, and may be wired together using the upper metal layers.

FIG. 3 is a detailed top down view of a connection zone of detail "B" of FIG. 2 between active chip areas, which shows the connection zone 31 around the die boundary 33 between adjacent active chip areas 32. In the connection zone, the wiring layers in the back end of line (BEOL) are used to provide electrical signal connections between adjacent chip sites.

FIG. 4 is a schematic of cross sectional view "B-B" in FIG. 3 that illustrates the wiring in a connection zone 31 about an exposure boundary 33 between active chip areas 32. FIG. 4 shows an upper layer 41 formed of tetraethyl orthosilicate (TEOS) or fluorinated TEOS (FTEOS) based oxide insulators with embedded Cu BEOL 42 wiring, a lower layer 43 formed of a low-k dielectric insulators with additional Cu BEOL wires, and active devices 44. There is no crack stop structure at the perimeter that would block connections since the dies are not diced out of the wafer. The upper levels of wiring are used for communications between chips. Exposures are "stitched" together to form connections across the boundary between die/exposures. The die/exposures either butt against each other or have a slight overlap. No active devices 44, such as transistors, etc., are present in the connection zone 31. The chips/dies may all be identical, or may be a mixture of unique chip types.

The individual layers of the wafer scale microchannel cooler and glass manifolds are shown schematically in FIGS. 5A-F, where the approximate thickness of each layer is also indicated. The bottom layer, shown in FIG. 5A, with the fins and channels facing up, would be a silicon microchannel wafer in which the channel patterns are aligned with the die sites on the processor wafer and the channels between staggered fins run horizontally. The next layer, shown in FIG. 5B, fabricated from a borosilicate glass disc by water jet cutting for example, includes alternating vertical inlet and outlet slits. An exemplary, non-limiting borosilicate glass is Schott's BOROFLOAT® 33. A vertical manifold layer, which is about 3.8 mm thick and is shown in FIG. 5C, is located adjacent to the vertical inlet and outlet slit layer. Above the vertical manifold layer is the separator layer, shown in FIG. 5D, and above the separator layer is a horizontal manifold layer, shown in FIG. 5E, which is about 6.5 mm thick. The separator layer serves to seal the vertical and horizontal manifolds and provide connections between them. The final inlet and outlet layer, shown in FIG. 5F, seals the horizontal manifold channels except where the inlet and outlet fittings will be subsequently attached.

The liquid flow path through this structure would start with an inlet fitting, proceed through an inlet opening to a horizontal manifold, through an opening in the manifold separator to a vertical inlet manifold, and then through a vertical inlet slit down to the microchannel wafer, where the water would be confined to the horizontal silicon channels until it reaches a vertical outlet slit and flows through a vertical manifold, an opening in the manifold separator to a horizontal manifold, and exits through an outlet opening and an outlet fitting. The vertical manifolds are tapered since coolant is being continuously provided to, or received from, the vertical inlets or outlets, and slits and microchannels along the length of the vertical manifolds.

The back surface of the microchannel wafer, and the back (non-active) surface of the product wafer that contain the multiple processor die sites are coated with a plurality of metal layers such as gold, which the solder will "wet", over nickel, which acts as a barrier, and over titanium, which acts as an adhesion layer. As described above with reference to FIG. 10, step 112, the processor wafer is soldered to the back surface of the microchannel wafer using a layer of a high lead solder such as Pb—Sn 97:3 or 95:5, or alternate solder material. A next step, step 114 of FIG. 10, is the attachment of the individual die substrates 13 to chip sites 21 on the processor wafer 11 using lead free C4s, shown in FIG. 6. This is accomplished by picking, aligning, and placing the substrates onto the product wafer, which is mounted onto the microchannel wafer and glass manifold, and then passing the assembly through a belt furnace to reflow the C4 micro solder balls to connect the individual die substrates to the die sites on the processor wafer. The substrate may be organic laminates with or without embedded capacitors or a CTE matched ceramic. Gaps may be provided between the substrates for cutting tolerance and to allow the dispensing of an underfill material.

As described above with reference to step 116 of FIG. 10, a next step in the assembly is the sequential attachment of the vertical power and I/O cards with a flip-chip bonder to the die substrates. In an exemplary, non-limiting embodiment, the cards are attached using eutectic Pb—Sn BGA solder balls with a pitch of about 0.5 mm. A top down view showing the array of vertical power card 14 and vertical I/O card 17 attached to the array of die substrates 13 is shown in FIG. 7. Note that the die substrates are smaller than the die sites on the underlying processor wafer. Perspective views of a single die substrate 13 with the attached vertical power card 14 and vertical I/O card 17 are shown in FIG. 8. The cards are oriented diagonally on the die substrates, and overlap adjacent die substrates, as a large card area is needed for the power and I/O requirements. Depending on the power requirements, the components for the final stages of the power conversion from 12 V to about 1 V require about three to four times the area which is available on the die substrate, so an additional card may be needed in close proximity to the die substrate. Given that there is an array of die substrates present, the best configuration is for the additional cards to be orientated perpendicular to the die substrates. In addition, a stiffener may be added to the flex attached region.

Figure 9:
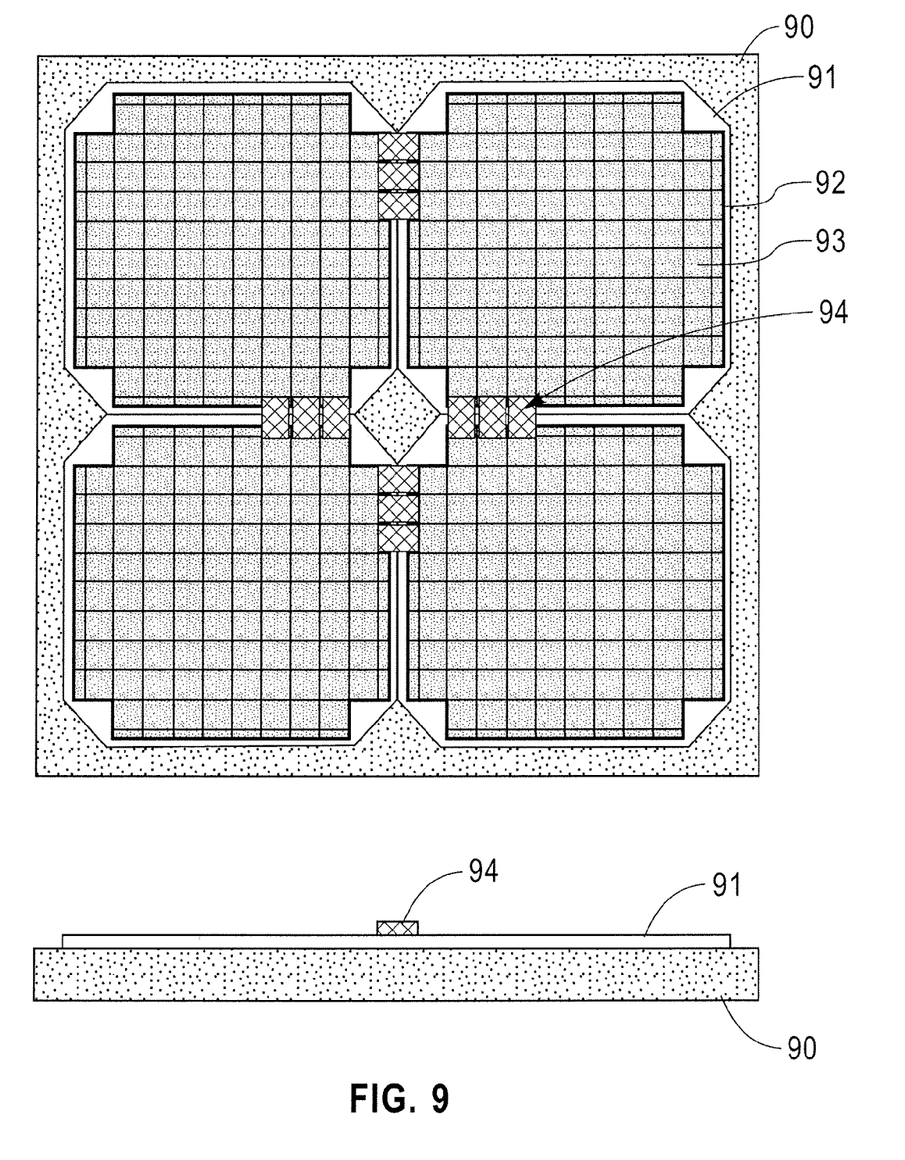
FIG. 9 illustrates another embodiment of the disclosure with two or more wafers attached to a common CTE matched liquid cooled substrate.

FIG. 9 depicts a top-down view and a side view of another non-limiting exemplary embodiment in the upper part and the lower part of the figure, respectively, in which multiple wafers are attached to a common CTE matched liquid cooled substrate. Referring to FIG. 9, a squared-off wafer 91 is disposed on a cooling substrate 90, and a plurality of processor chips 93 and a plurality of edge chips 92 are formed on the squared-off wafer 91, organized into four groups. An interconnect substrate 94 formed over the edge chips 92 connects the groups of chips. Note that substrates on the processor chips and more interconnect substrates are not shown for clarity. This embodiment differs from the embodiment of FIGS. 1-8 in that the processor wafers are squared off on one or more edges, and electrical interconnect substrates are used to provide high bandwidth electrical signaling between adjacent edges. The electrical interconnect substrates could consist of flex, multilayer flex, an organic substrate with multiple build-up layers, or a silicon chip with multiple wiring layers and could be connected to the processor wafers with fine pitch micro solder bumps. An exemplary, non-limiting fine pitch is in a range of about 5-50 microns. Specialized edge I/O chips maybe used to connect to the interconnect substrates. The cooling substrate would include multiple glass manifold layers, each of which extends across the full size of the assembled structure, and one or more silicon microchannel wafers attached to the glass manifold and to which the processor wafers are attached.

While embodiments of the present disclosure has been described in detail with reference to exemplary embodiments, those skilled in the art will appreciate that various modifications and substitutions can be made thereto without departing from the spirit and scope of the invention as set forth in the appended claims

What is claimed is:

1. A semiconductor structure comprising:
a substrate that includes one or more cooling layers, one or more cooling channels, one or more coolant inlets and outlets in fluid communication with the cooling channels, a device layer disposed on the cooling layers that has one or more connection points and a device layer area, wherein a device layer thermal coefficient of expansion is substantially equal to that of the one or more cooling layers;
a plurality of laminate substrates arranged in an array that are disposed on, and electrically attached to, the device layer, wherein a laminate substrate thermal coefficient of expansion differs from that of the device layer, and each laminate substrate is smaller in area than an area of the device layer portion to which it is attached, and each laminate substrate includes sides with, gaps between sides of adjacent laminate substrates,
wherein the laminate substrates are not electrically or mechanically connected to each other across the gaps between laminate substrates and the laminate substrates are small enough to substantially prevent warping and unacceptable stress of the device layer, interconnection and cooling layers due to thermal expansion.

2. The semiconductor structure of claim 1, wherein the laminate substrates comprise one or more of a PC board, a ceramic or glass substrate, and a built-up organic substrate and the device layer is rigidly attached to the cooling layers by a material with a high thermal conductivity.

3. The semiconductor structure of claim 1, wherein the device layer comprises one or more semiconductor wafers.

4. The semiconductor structure of claim 1, wherein the substrate comprise one or more of glass and a semiconductor material.

5. The semiconductor structure of claim 1, wherein the connection points comprise C4 micro solder balls disposed between the device layer and the laminate substrates.

6. The semiconductor structure of claim 1, further comprising
a plurality of semiconductor structures,
a wafer gap between each semiconductor structure, and
one or more electrical connections between laminate substrates on different semiconductor structures across the wafer gaps,
wherein one or more of the coolant inlets and outlets of each semiconductor structure are connected to form a common cooling system.

7. A data processing structure comprising:
a semiconductor processor wafer containing two or more chips interconnected by on chip wiring levels rigidly attached on a non-device side of the semiconductor processor wafer to a liquid cooled substrate with a thermal coefficient of expansion substantially similar to that of the semiconductor processor wafer,
wherein substrates of each chip are attached to individual chips on a device side of each wafer.

8. The data processing structure of claim 7, wherein the chip substrates are smaller in area than the chips on the wafer.

9. The data processing structure of claim 7, further comprising one or more cards attached to each chip substrate, wherein a major surface of each card is perpendicular to a surface of the semiconductor processor wafer.

10. The data processing structure of claim 7, further comprising one or more additional wafers stacked between the semiconductor processor wafer and the chip substrates that are electrically interconnected with the semiconductor processor wafer and the chip substrates.

11. A super computer structure, comprising;
two or more semiconductor processor wafers, each containing two or more chips interconnected by on chip wiring levels rigidly attached on a non-device side of the semiconductor processor wafer to one or more silicon microchannel wafers which are attached to a common set of manifold layers to provide liquid cooling; and
interconnect substrates configured to provide signaling between adjacent semiconductor processor wafers,
wherein the manifold layers have a thermal coefficient of expansion substantially similar to that of the silicon microchannel wafers, and
chip substrates are attached to each chip on a device side of the semiconductor processor wafer.

12. The data processing structure of claim 11, wherein the manifold layers comprise one or more of integrated glass or silicon layers, and one or more stacked silicon layers.

13. The data processing structure of claim 11, wherein the semiconductor processor wafers include multiple stacked wafers that are integrated by vertical interconnections.

14. The data processing structure of claim 11, wherein the semiconductor processor wafers include one or more of a memory wafer, a processor wafers, and a field programmable gate array (FPGA).

15. The data processing structure of claim 11, wherein each chip substrate comprises one of an organic material, a ceramic material, or a silicon material, and each chip substrate is configured to provide the semiconductor processor wafer with power, voltage regulation, and signal communication.

16. The data processing structure of claim 11, wherein signaling between adjacent semiconductor processor wafers uses one or more electrical signals and optical signals.

* * * * *